(12) United States Patent
Yoon et al.

(10) Patent No.: US 10,987,691 B2
(45) Date of Patent: Apr. 27, 2021

(54) METHOD AND APPARATUS FOR CONTROLLING PATTERN-WIDTH OF COATING LIQUID DISPENSED FROM A NOZZLE

(71) Applicant: TTNS INC., Gyeonggi-do (KR)

(72) Inventors: Byung Kook Yoon, Seoul (KR); Ju Yeop Jang, Seoul (KR)

(73) Assignees: TTNS INC., Gyeonggi-do (KR); Byung Kook Yoon, Seoul (KR)

( * ) Notice: Subject to any disclaimer, the term of this patent is extended or adjusted under 35 U.S.C. 154(b) by 95 days.

(21) Appl. No.: 16/234,920

(22) Filed: Dec. 28, 2018

(65) Prior Publication Data
US 2019/0201929 A1 Jul. 4, 2019

(30) Foreign Application Priority Data
Jan. 3, 2018 (KR) .................. 10-2018-0000915

(51) Int. Cl.
*B05D 1/02* (2006.01)
*B05B 12/08* (2006.01)
(Continued)

(52) U.S. Cl.
CPC .......... *B05B 12/082* (2013.01); *B05B 12/004* (2013.01); *B05B 12/084* (2013.01);
(Continued)

(58) Field of Classification Search
None
See application file for complete search history.

(56) References Cited

U.S. PATENT DOCUMENTS

| 7,188,781 B2 | 3/2007 | Reighard et al. |
| 8,213,693 B1 * | 7/2012 | Li ................... A61B 34/20 |
| | | 382/128 |

(Continued)

FOREIGN PATENT DOCUMENTS

| JP | H08-206563 A | 8/1996 |
| JP | 2012-104732 A | 5/2012 |

(Continued)

*Primary Examiner* — Alexander M Weddle
(74) *Attorney, Agent, or Firm* — Roberts Calderon Safran & Cole P.C.

(57) ABSTRACT

Disclosed is a method for controlling the pattern-width of a coating liquid dispensed from a nozzle. The method includes the steps of: dispensing the coating liquid downward from the nozzle in a dispensing position on a measurement reference line to photograph with a camera positioned at a predetermined horizontal distance from the measurement reference line arranged perpendicularly to a coating reference surface; calculating the pattern-width of the coating liquid on the coating reference surface from image data obtained by photographing the coating liquid dispensed from the nozzle in the dispensing position with the camera; comparing the calculated pattern-width of the coating liquid with a coating liquid reference pattern-width; and adjusting dispensing pressure by increasing or decreasing pressure of air supplied to a pressure container that provides the coating liquid to the nozzle when the calculated pattern-width of the coating liquid is outside the reference allowed error.

6 Claims, 8 Drawing Sheets

(51) Int. Cl.
*B05B 12/12* (2006.01)
*B05B 12/00* (2018.01)
*H05K 13/04* (2006.01)

(52) U.S. Cl.
CPC ....... *B05B 12/124* (2013.01); *H05K 13/0469* (2013.01); *B05D 1/02* (2013.01)

(56) References Cited

U.S. PATENT DOCUMENTS 9,789,497 B1 * 10/2017 Orla-Jensen .............. B05B 1/30
2006/0222231 A1 * 10/2006 Harris ................... G06T 7/0006
382/141
2010/0310757 A1 * 12/2010 Ooshiro .................. B41J 2/165
427/8

FOREIGN PATENT DOCUMENTS

| KR | 10-2007-0062325 A | 6/2007 | |
| KR | 10-2010-0093215 A | 8/2010 | |
| WO | WO-2016135634 A1 * | 9/2016 | ........... B05B 12/082 |
| WO | WO-2017079366 A1 * | 5/2017 | ........... B05B 12/082 |

* cited by examiner

【Figure 1】
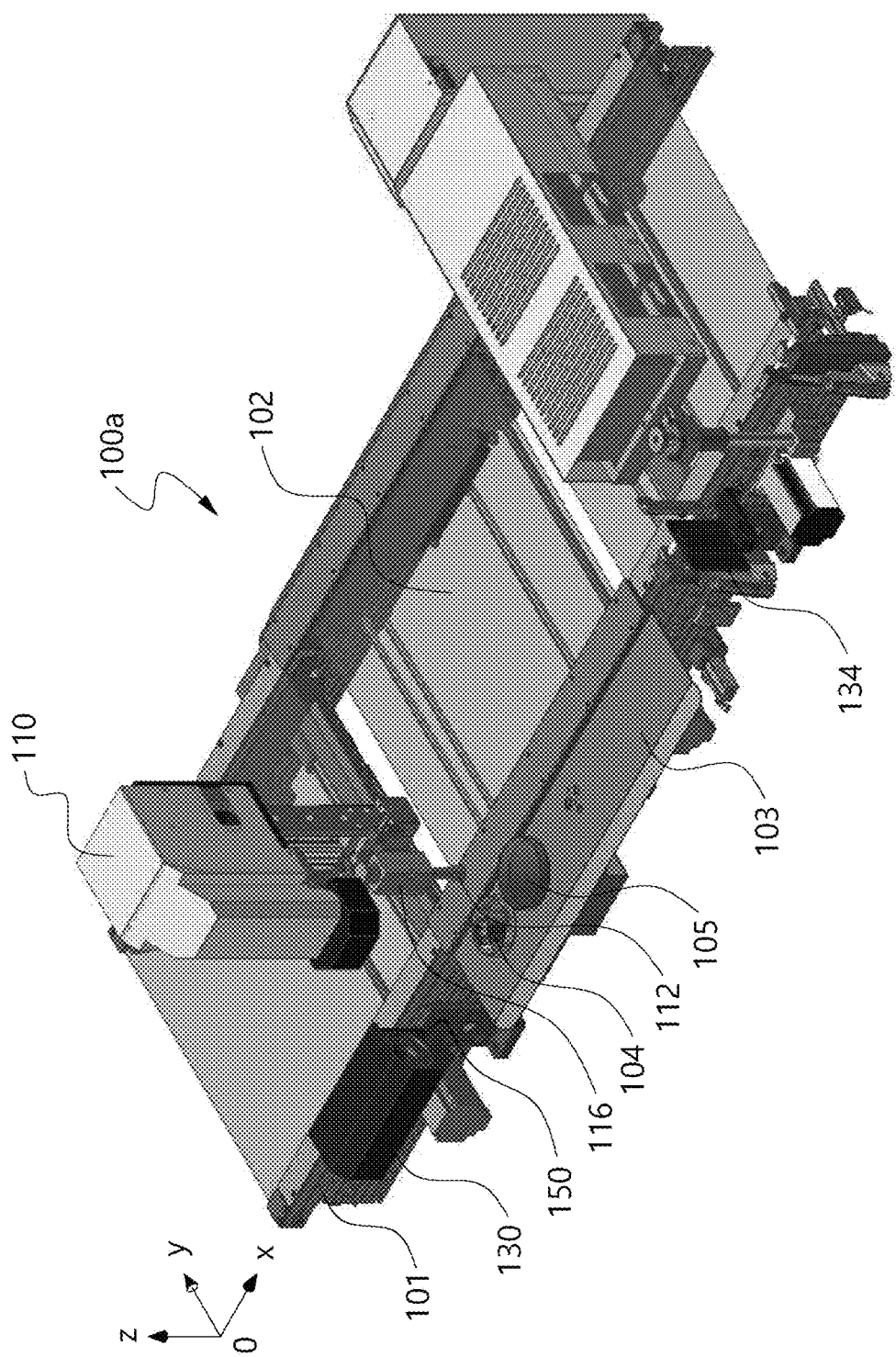

【Figure 2】
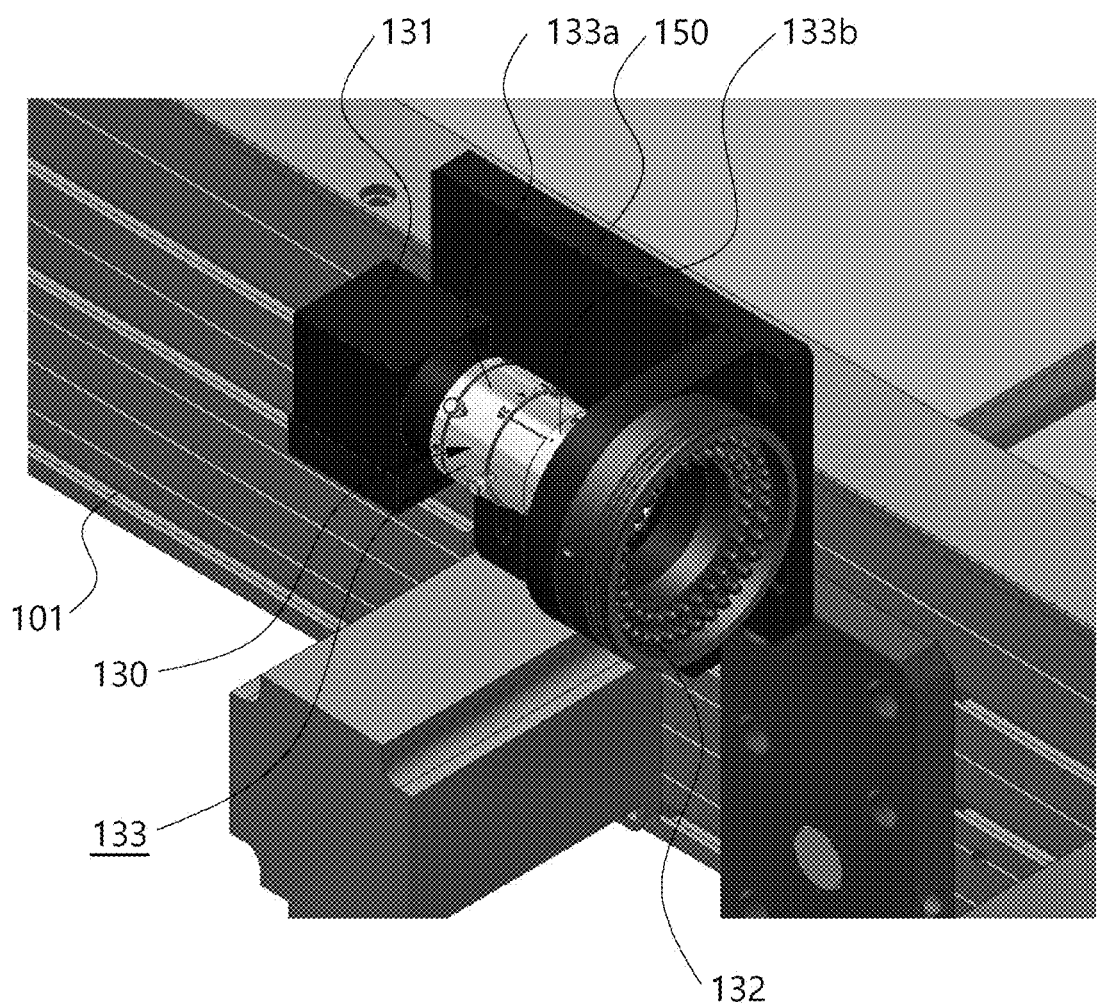

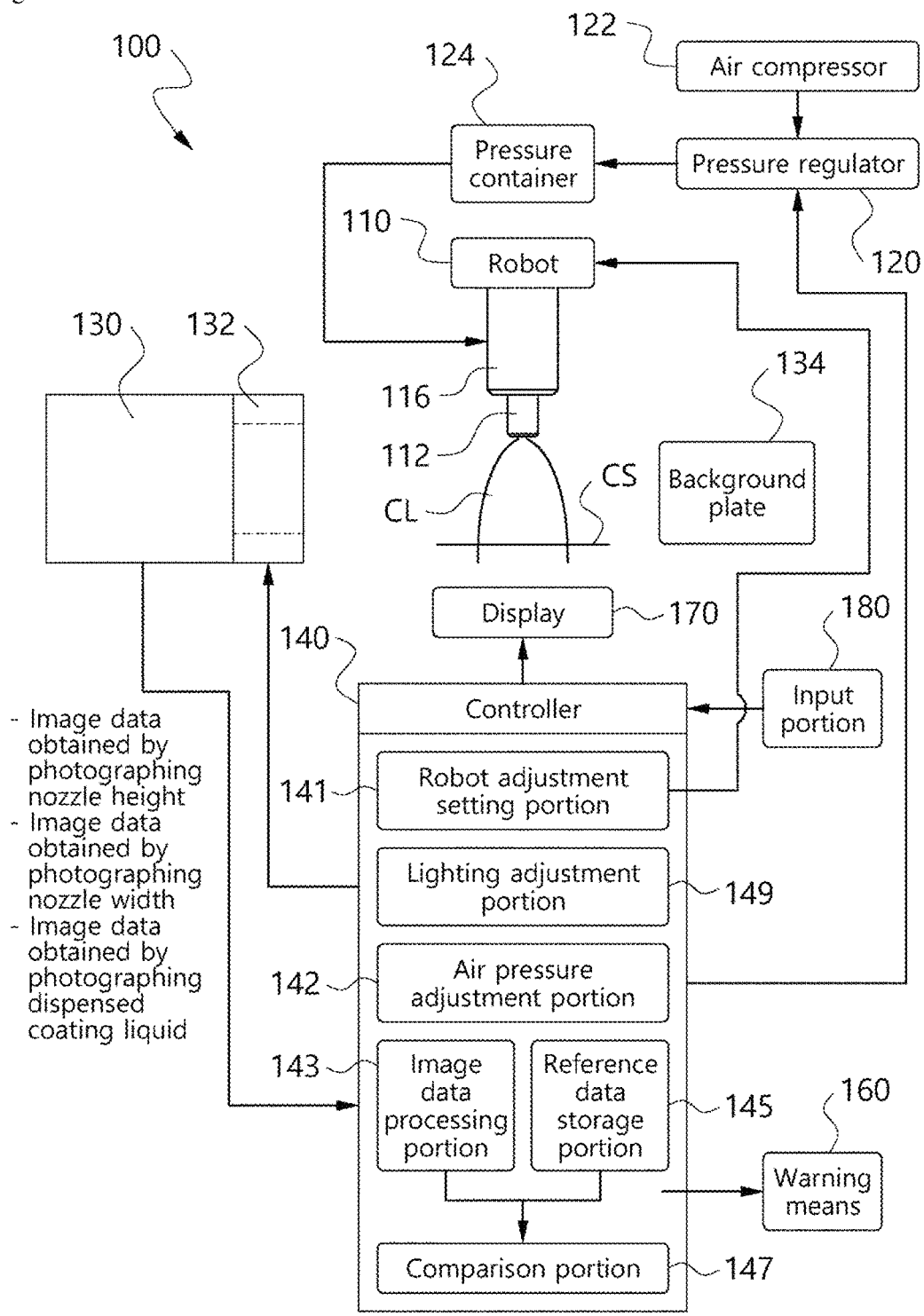
[Figure 3]

[Figure 4A]
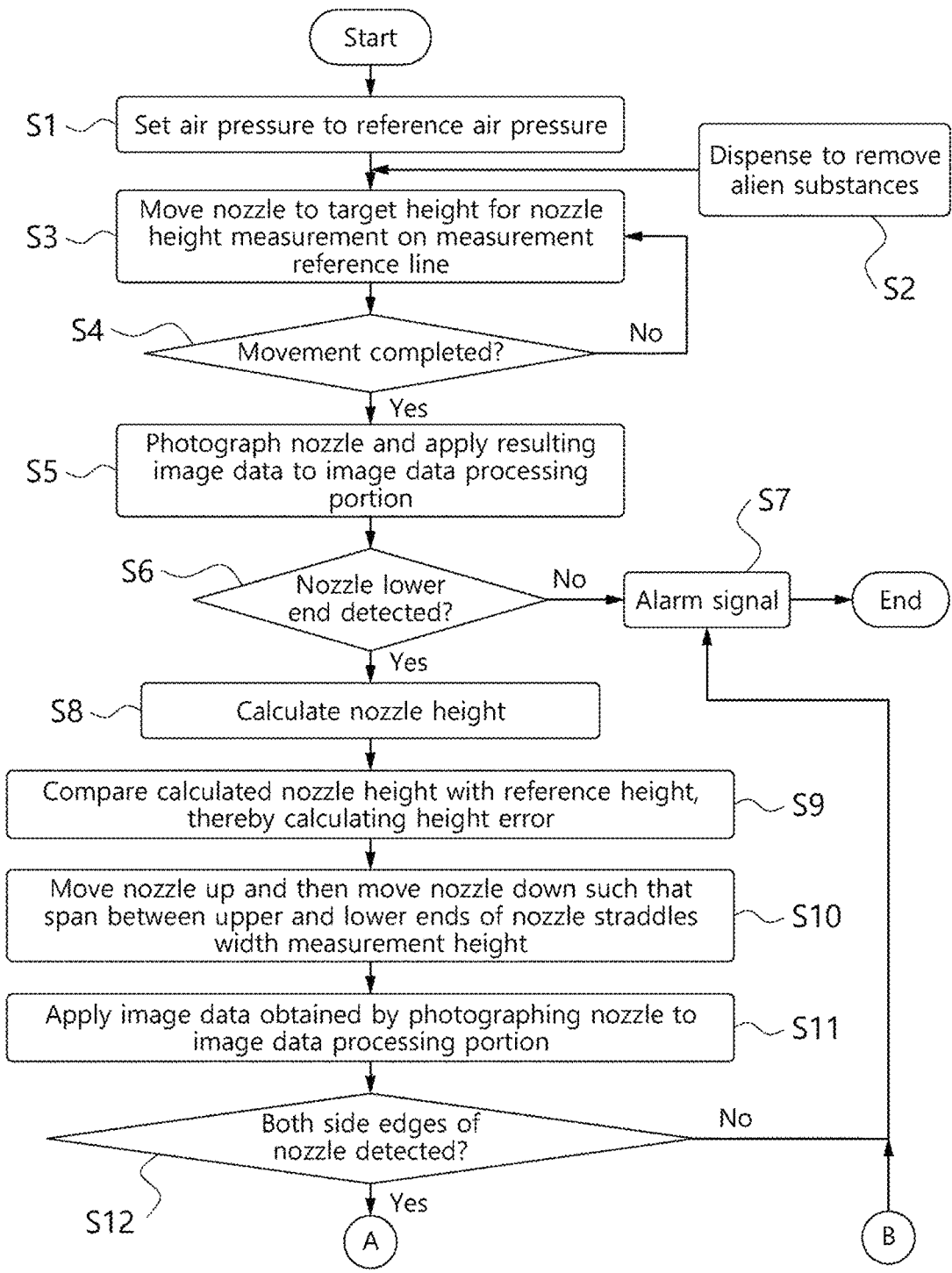

[Figure 4B]
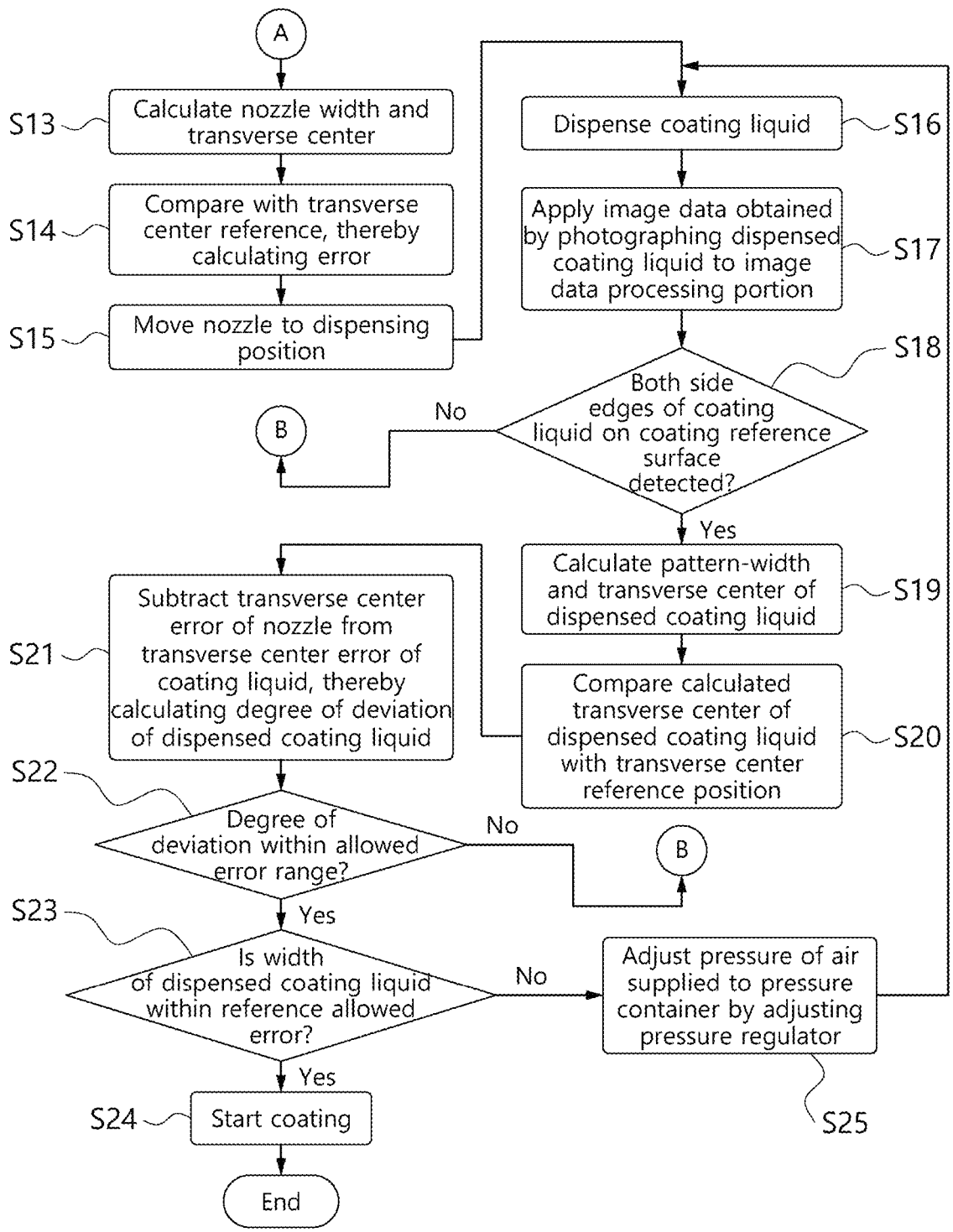

[Figure 5]
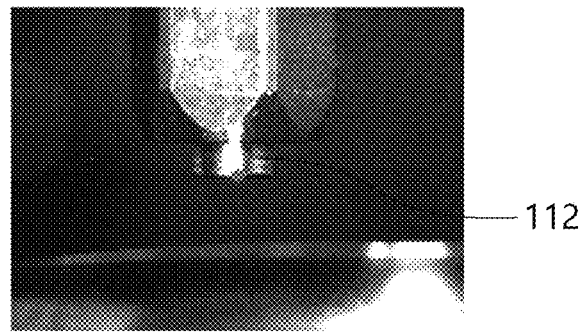
[Figure 6]
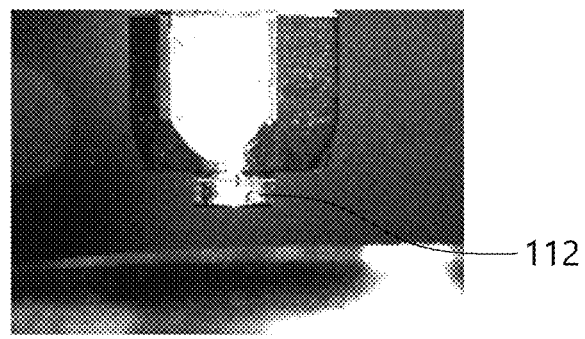
[Figure 7]
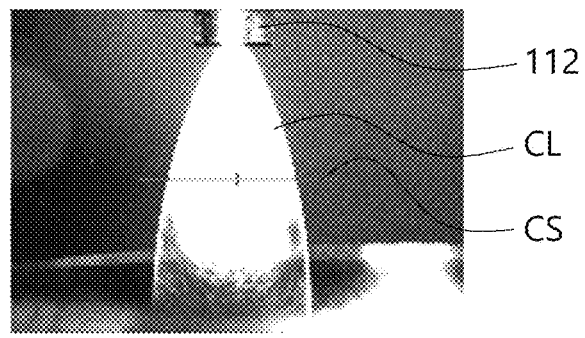

【Figure 8】
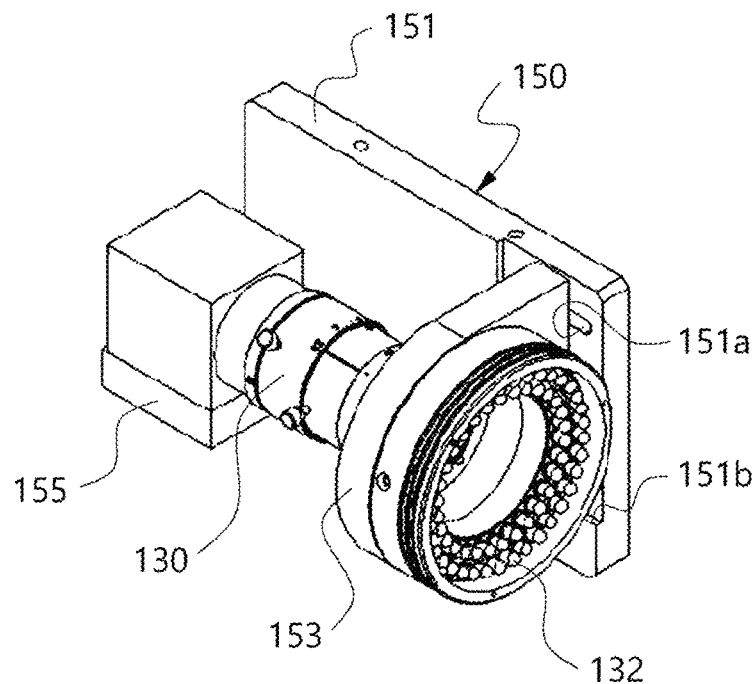
【Figure 9】
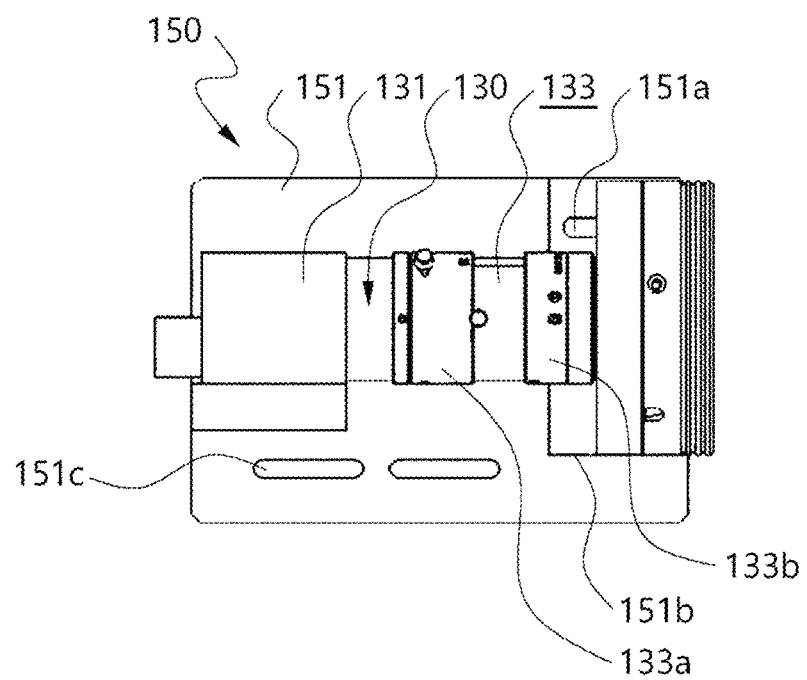

【Figure 10】
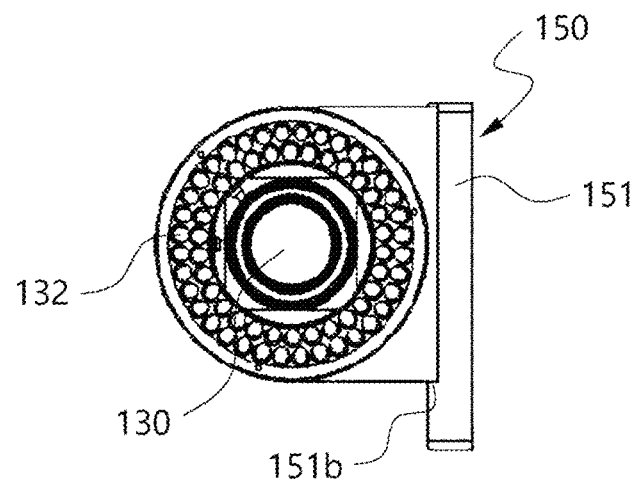
【Figure 11】
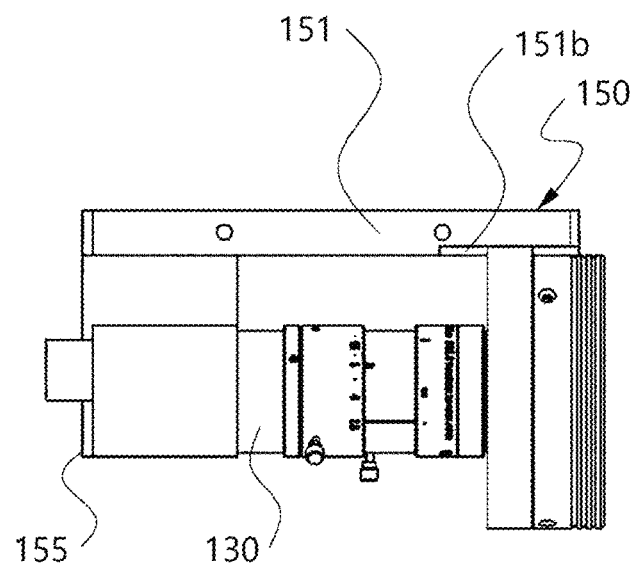

METHOD AND APPARATUS FOR CONTROLLING PATTERN-WIDTH OF COATING LIQUID DISPENSED FROM A NOZZLE

BACKGROUND OF THE INVENTION

1. Field of the Invention

The present invention relates to improvement of a method and an apparatus that can be appropriately used to control the pattern-width of coating liquid dispensed from a nozzle in a non-atomized film pattern type.

2. Description of the Prior Art

In general, it is necessary to apply a protective conformal coating film in a predetermined area of printed circuit board. For example, a printed circuit board coating material is used to protect selected components of a circuit board from moisture, dust, hazardous gases and the like. Such coatings need to be performed very accurately and precisely by a pattern-overlap on the printed circuit board. Otherwise, moisture or hazardous chemical materials may infiltrate the uncoated part. Therefore, an accurate/precise control of the pattern-width of dispensed coating liquid is crucial for obtaining a high-quality protective film on printed circuit boards.

It is known that there are various liquid coating methods available in the performance of protective film-build on the printed circuit board. In order to accurately position a coating liquid on printed circuit board, the pattern-width of the coating liquid dispensed from the nozzle needs to be measured and controlled accurately. A relevant prior art is disclosed in U.S. Pat. No. 7,188,781 B2 (of Michael A. Reighard et al, entitled "METHOD AND APPARATUS FOR DETECTING A LIQUID SPRAY PATTERN") wherein a laser is used to measure both ends of a coating liquid dispensed from a nozzle by means of an optical fiber sensor or a laser sensor (pointer).

According to this prior art, both ends of a non-atomized film patterns are measured through two measurement sessions, and the coating liquid needs to be dispensed continuously for a long time such that the optical fiber sensor or laser sensor distinguishes the inside and outside of the non-atomized film pattern. Accordingly, this prior art not only degrades the efficiency of coating operation, but also requires a large amount of coating liquid. The prior art also has a drawback in that characteristics (for example, the diameter) specific to the optical fiber sensor or the laser pointer may result in a measurement error of approximately 3 mm.

The prior art has another problem in that the height of the nozzle cannot be modified accurately. The prior art also has such a structure wherein the valve to which the nozzle is attached can be separated from the robot, and such separation and reattachment are normally required during a maintenance or replacement. A mechanical clearance may occur during reattachment and, in that case, the coordinate (X, Y, Z) of the nozzle portion on the end of the valve may have an error with regard to the reference value.

SUMMARY OF THE INVENTION

An object of the present invention is to provide a method for controlling the pattern-width of a coating liquid dispensed from a nozzle, wherein the pattern-width of the dispensed coating liquid can be measured and controlled precisely compared with the prior art.

Another object of the present invention is to provide a method for controlling the pattern-width of a coating liquid dispensed from a nozzle, wherein the pattern-width of the dispensed coating liquid can be quickly measured and controlled compared with the prior art such that the time needed to coat a board with the solution can be reduced, and the amount of solution consumed to set the pattern-width of the dispensed coating liquid can be reduced.

Another object of the present invention is to provide a method for controlling the pattern-width of a coating liquid dispensed from a nozzle, wherein the height of the nozzle can be modified precisely.

Another object of the present invention is to provide an apparatus that enables implementation of a method according to the present invention.

A method for controlling the pattern-width of a coating liquid dispensed from a nozzle according to the present invention includes: dispensing the coating liquid downward from the nozzle in a dispensing position on a measurement reference line to photograph with a camera positioned at a predetermined horizontal distance from the measurement reference line arranged perpendicularly to a coating reference surface; photographing the dispensed coating liquid with the camera; calculating the pattern-width of the coating liquid on the coating reference surface from image data obtained by photographing the coating liquid dispensed from the nozzle in the dispensing position with the camera; comparing the calculated pattern-width of the coating liquid with a coating liquid reference pattern-width and thereby determining whether or not the calculated pattern-width of the coating liquid is outside a reference allowed error range; and adjusting dispensing pressure by increasing or decreasing pressure of air supplied to a pressure container that provides the coating liquid to the nozzle when the calculated pattern-width of the coating liquid is outside the reference allowed error.

Preferably, pressure is increased or decreased for a preset time. It may be confirmed, when the time to increase or decrease the pressure exceeds a preset threshold time, that pressure adjustment is impossible, and an alarm may be issued. This may correspond to a case in which the physical property of the coating liquid is changed, a case in which the nozzle is heavily contaminated, a case in which no change occurs above/below a predetermined pressure, or a case in which no pattern is formed.

Preferably, the dispensing, the photographing, the calculating, the comparing, and the adjusting dispensing pressure are repeated until the pattern-width of the coating liquid calculated for a preset time enters the reference allowed error range of the coating liquid reference pattern-width.

Preferably, the method further includes, prior to the dispensing: calculating a height error of the nozzle, with regard to a height reference on an obtained image or with regard to the coating reference surface, from image data obtained by photographing the nozzle on the measurement reference line with the camera; and moving the nozzle upward/downward to the dispensing position along the measurement reference line in view of the height error.

If necessary, the method may include: finding a pixel having an abruptly changing brightness contrast value within a preset range near an edge of the nozzle or near an edge of the dispensed coating liquid in order to calculate at least one selected from the height of the nozzle, the width of the nozzle, and the pattern-width of the dispensed coating liquid; and generating an alarm signal when failing to measure the height of the nozzle or the width of the nozzle from image data obtained by photographing the nozzle on the measurement reference line, or when failing to measure the pattern-width of the dispensed coating liquid, prior to the dispensing.

If necessary, the method may include, performing at least one selected from height error calculation, nozzle transverse error calculation, and coating liquid transverse error calculation so as to calculate at least one selected from the height error of the nozzle, the transverse error of the nozzle, and the transverse error of the coating liquid, comparing the calculated one with a reference value, and generating an alarm signal when the calculated one is outside an allowed error, wherein in the height error calculation, the height error of the nozzle is calculated prior to the dispensing, with regard to a height reference on an obtained image or with regard to the coating reference surface, from image data obtained by photographing the nozzle on the measurement reference line with the camera, in the nozzle transverse error calculation, the width of the nozzle is calculated from image data obtained by photographing the nozzle straddling the width measurement height, the transverse center of the nozzle is found, and the error of the transverse center of the nozzle is calculated with regard to the transverse center reference on the obtained image, and in the coating liquid transverse error calculation, the transverse center of the coating liquid on the coating reference surface is found from image data obtained by photographing the coating liquid, and the error of the transverse center of the coating liquid is calculated with regard to the transverse center reference on the obtained image.

If necessary, the method may include: calculating the transverse error of the nozzle prior to the dispensing by calculating the width of the nozzle from image data obtained by photographing the nozzle on the measurement reference line, finding the transverse center of the nozzle, and calculating the error of the transverse center of the nozzle with regard to the transverse center reference on the obtained image; calculating the coating liquid transverse error by finding the transverse center of the coating liquid on the coating reference surface from image data obtained by photographing the coating liquid and calculating the error of the transverse center of the coating liquid with regard to the transverse center reference on the obtained image; subtracting the error of the transverse center of the nozzle from the error of the transverse center of the coating liquid and thereby calculating the degree of deviation of the coating liquid with regard to the nozzle; determining whether or not the calculated degree of deviation of the coating liquid is outside an allowed error; and generating an alarm signal when the degree of deviation of the coating liquid is outside the allowed error.

In addition, the method may further include: calculating a height error by calculating a height error of the nozzle, with regard to a height reference on an obtained image or with regard to the coating reference surface, from image data obtained by photographing the nozzle on the measurement reference line with the camera; and moving the nozzle upward/downward to the dispensing position along the measurement reference line in view of the height error. The calculating the transverse error of the nozzle may be performed from image data obtained by moving the nozzle downward and photographing the nozzle with the camera, after the calculating a height error.

An apparatus for controlling the pattern-width of a coating liquid dispensed from a nozzle according to the present invention includes: a robot including a nozzle for dispensing a solution supplied from a pressure container and a valve for opening/closing a channel for movement of the solution supplied to the nozzle, the robot being capable of moving the nozzle upward/downward along a measurement reference line arranged perpendicularly to a coating reference surface; a pressure regulator for adjusting pressure of air compressed by a compressor and supplied to the pressure container; a camera positioned at a predetermined horizontal distance from the measurement reference line so as to photograph the nozzle on the measurement reference line and the coating liquid dispensed from the nozzle, thereby obtaining image data of the nozzle and the spayed coating liquid on the coating reference surface; and a controller capable of adjusting the posture of the robot, the controller calculating the pattern-width of the dispensed coating liquid on the coating reference surface from image data of the dispensed coating liquid applied from the camera, the controller comparing the calculated pattern-width with reference data and, when the pattern-width of the dispensed coating liquid is outside a reference allowed error range as a result of the comparison, controlling operation of the pressure regulator so as to increase or decrease pressure of air supplied to the pressure container until the pattern-width of the dispensed coating liquid enters the reference allowed error range.

Preferably, the controller includes: an image data processing portion for finding and calculating the pattern-width of the dispensed coating liquid on the coating reference surface and the transverse center of the dispensed coating liquid from image data obtained by photographing the nozzle dispensing coating liquid on the measurement reference line with the camera; a reference data storage portion storing data regarding the measurement reference line, the coating reference surface, the reference pattern-width of the coating liquid, the reference allowed error regarding the pattern-width of the coating liquid, the transverse center reference of the coating liquid, and the transverse allowed error of the transverse center of the coating liquid; and a comparison portion for comparing the value calculated by the image data processing portion with reference data stored in the data storage portion, thereby calculating an error value, and determining whether or not the calculated error value is within an allowed range.

If necessary, the controller may include: an image data processing portion for calculating the pattern-width of the dispensed coating liquid on the coating reference surface, the transverse center of the dispensed coating liquid, and the height of the nozzle from image data obtained by photographing the nozzle dispensing the coating liquid on the measurement reference line with the camera; a reference data storage portion storing data regarding the measurement reference line, the coating reference surface, the width of the nozzle, the transverse center reference of the nozzle, the transverse allowed error of the transverse center of the nozzle, the reference pattern-width of the coating liquid, the reference allowed error regarding the pattern-width of the coating liquid, the transverse center reference of the coating liquid, and the transverse allowed error of the transverse center of the coating liquid; and a comparison portion for comparing the value calculated by the image data processing portion with reference data stored in the data storage portion, thereby calculating an error value, and determining whether or not the calculated error value is within an allowed range.

If necessary, the controller may include: an image data processing portion for finding and calculating the pattern-width of the dispensed coating liquid on the coating reference surface, the transverse center of the dispensed coating liquid, the height of the nozzle, the width of the nozzle, and the transverse center of the nozzle from image data obtained by photographing the nozzle dispensing the coating liquid on the measurement reference line with the camera; a reference data storage portion storing data regarding the measurement reference line, the coating reference surface, the height reference regarding the nozzle, the width of the nozzle, the transverse center reference of the nozzle, the transverse allowed error of the transverse center of the nozzle, the reference pattern-width of the coating liquid, the reference allowed error regarding the pattern-width of the coating liquid, the transverse center reference of the coating liquid, and the transverse allowed error of the transverse center of the coating liquid; and a comparison portion for comparing the value calculated by the image data processing portion with reference data stored in the data storage portion, thereby calculating an error value, and determining whether or not the calculated error value is within an allowed range.

Preferably, the data storage portion stores ROI data having a range defined so as to find a pixel having an abruptly changing brightness contrast value near an edge of the nozzle or near an edge of the dispensed coating liquid, and the apparatus includes a warning means for generating a warning signal under the control of the controller when the image data processing portion fails to calculate one selected from the height of the nozzle, the width of the nozzle, and the pattern-width of the dispensed coating liquid, or when the calculated error value exceeds a preset value.

Preferably, the controller includes a robot adjustment setting portion for adjusting operation of the robot according to a preset order.

Preferably, the apparatus includes: a lighting for emitting light toward the nozzle and the dispensed coating liquid; and a background plate installed on the opposite side of the camera with reference to the measurement reference line so as to absorb light. The controller includes a lighting adjustment portion for adjusting the brightness of the lighting. The camera includes a camera body and a lens portion mounted on the camera body. The lens portion can zoom or adjust the focus through a focus adjustment portion, and can adjust the exposure value through an exposure value adjustment portion.

Preferably, the camera is installed such that the distance between the camera and the measurement reference line can be adjusted by a bracket mechanism.

The present invention is advantageous in that dispensing a coating liquid once for a short time is enough to measure the pattern-width of the dispensed coating liquid and to instantly adjust the pattern-width, thereby making it possible to substantially reduce the amount of the dispensed coating liquid consumed to measure and adjust the pattern-width of the coating liquid and the time required therefor.

In addition, the pattern-width of the coating liquid dispensed from the nozzle can be measured by using pixels of image data obtained by the camera, and the measurement accuracy is accordingly high.

Moreover, not only both transverse side edges of the dispensed coating liquid are found and measured, but reference points for the height of the end of the nozzle and the degree of twisting thereof can be measured first, if needed, thereby providing an excellent measurement accuracy. An error of about 3 mm may occur when the pattern-width of the dispensed coating liquid is measured by a conventional method, but the measurement accuracy can be improved to 10 μm according to the present invention.

That is, the present invention is advantageous in that measurement accuracy regarding the pattern-width of the dispensed coating liquid is increased, thereby improving the board coating quality; the time to set the pattern-width of the coating liquid is reduced, thereby improving the production efficiency; and the amount of the coating liquid necessary to set the pattern-width of the coating liquid is reduced, thereby reducing the production cost.

BRIEF DESCRIPTION OF THE DRAWINGS

FIG. 1 is a perspective view illustrating the configuration of major parts of a board coating device to which the present invention is applied;

FIG. 2 is a magnified view of a camera mounted on a frame of the board coating device;

FIG. 3 is a block diagram illustrating the configuration of an apparatus for controlling the pattern-width of a coating liquid dispensed from a nozzle according to the present invention;

FIG. 4A and FIG. 4B are flowcharts illustrating processes of a method for controlling the pattern-width of a coating liquid dispensed from a nozzle according to the present invention;

FIG. 5 is a photograph of a nozzle obtained to calculate the height of the nozzle;

FIG. 6 is a photograph of a nozzle obtained to calculate the width of the nozzle;

FIG. 7 is a photograph of a dispensed coating liquid obtained to calculate the pattern-width of the dispensed coating liquid on a coating reference surface;

FIG. 8 is a perspective view of a camera mounted on a bracket; and

FIG. 9 to FIG. 11 are the front view, the right-side view, and the top view of FIG. 8, respectively.

DETAILED DESCRIPTION OF THE EXEMPLARY EMBODIMENTS

Hereinafter, preferred embodiments of the present invention will be described in detail with reference to the accompanying drawings.

FIG. 1 is a perspective view illustrating the configuration of major parts of a board coating device to which the present invention is applied. FIG. 2 is a magnified view of a camera mounted on a frame of the board coating device. FIG. 3 is a block diagram illustrating the configuration of an apparatus for controlling the pattern-width of a coating liquid dispensed from a nozzle according to the present invention.

Referring to FIG. 1 and FIG. 2, the board coating device 100a includes a frame 101. The frame 101 has a guide portion 102 formed at the center portion thereof so as to guide the movement of a board such that a board supposed to undergo a coating operation can be guided thereto and can move away therefrom after the coating operation is finished. A robot 110 for coating is provided above the frame 101. The robot 110 is coupled to a vertical shaft to be able to move upward/downward. The vertical shaft is installed on a horizontal shaft (not illustrated) to be able to move leftward/rightward. The horizontal shaft is provided above the frame and installed to be able to move forward/backward. Accordingly, the robot 110 can move forward/backward, leftward/rightward, and upward/downward. The robot 110 has a nozzle 112 mounted thereon so as to dispense a solution. The configuration for movement of the robot 110 is a widely known prior art, and detailed description thereof will be omitted herein.

As illustrated in FIG. 1, a container support 103 is installed on the front part of the frame 101. A first container 104 and a second container 105 are arranged on the container support 103 at an interval in the leftward/rightward direction. The first container 104 contains a solvent for preventing hardening of the solution to be dispensed from the nozzle 112. The second container 105 is used to collect the solution dispensed from the nozzle 112 during setting. The configuration of the apparatus 100 for controlling the pattern-width of a coating liquid dispensed from a nozzle according to the present invention, which can be appropriately applied to such a board coating device 100a, will be described in detail with reference to FIG. 3.

The apparatus 100 for controlling the pattern-width of a coating liquid dispensed from a nozzle according to the present invention includes a robot 110 having a nozzle 112 mounted thereon so as to dispense a solution supplied from a pressure container 124 in the downward direction and having a valve 116 mounted thereon so as to close/open a channel for movement of air and the solution supplied to the nozzle 112.

As described above, the robot 110 can move forward/backward, leftward/rightward, and upward/downward, and the nozzle 112 can accordingly move along the x, y, and z axes of the three-dimensional coordinate system as illustrated in FIG. 1, and has a rotating shaft and thus can rotate the nozzle. Therefore, the robot 110 can move the nozzle 112 upward/downward along a specific measurement reference line used for photography the camera 130. The measurement reference line according to the present invention is a vertical line which is parallel with the z-axis, and which is at a predetermined horizontal distance from the camera 130. The measurement reference line is arranged perpendicularly to the horizontal coating reference surface CS on which a board is coated. The center of the nozzle 112 moves upward/downward along the measurement reference line when the nozzle 112 and the dispensed coating liquid CL are photographed by the camera 130 in order to calculate the height and width of the nozzle 112 and the pattern-width of the dispensed coating liquid CL.

The apparatus 100 for controlling the pattern-width of a coating liquid dispensed from a nozzle according to the present invention includes a pressure regulator 120 for adjusting air pressure inside the pressure container 124 that supplies the nozzle 112 with a coating liquid, and a camera 130 for obtaining image data of the nozzle 112 and the coating liquid CL dispensed from the nozzle 112. The camera 130 includes a camera body 131 and a lens portion 133 mounted on the camera body 131. The lens portion 133 can zoom or adjust the focus through a focus adjusting portion 133a, and can adjust the exposure value through an exposure value adjusting portion 133b.

A pressure container 124 is connected to the pressure regulator 120 and is positioned between the same and the valve 116 so as to store a coating liquid to be dispensed, and an air compressor 122 is connected to the opposite side of the pressure container 124. The pressure regulator 120 is for the purpose of adjusting the pressure inside the pressure container 124 by adjusting the supply of compressed air to the pressure container 124 between the air compressor 122 and the pressure container 124. The pattern-width of the coating liquid CL dispensed from the nozzle 112 can be adjusted by adjusting the pressure inside the pressure container 124.

The camera 130 is fixedly installed on the frame 101, which is positioned at a predetermined horizontal distance from the measurement reference line, by a bracket mechanism 150 so as to photograph the nozzle 112 positioned on the measurement reference line and the coating liquid CL dispensed from the nozzle 112, in order to obtain image data of the nozzle 112 on the measurement reference line and the dispensed coating liquid CL. The focus or height of the camera 130 is preferably adjusted to conform to the reference height on the measurement reference line.

A lighting portion 132 made of an LED, for example, is provided to obtain high-quality image data. The lighting portion 132 may be configured by arranging a plurality of LEDs in an annular shape on the front side of the camera 130. A background plate 134 is installed on the opposite side of the camera 130, with reference to the photographed nozzle 112, so as to absorb light such that the edge of the photographed nozzle 112 or that of the dispensed coating liquid can be distinguished clearly.

The apparatus 100 for controlling the pattern-width of a coating liquid dispensed from a nozzle according to the present invention includes a controller 140 for processing image data applied from the camera 130 and controlling the operation of the pressure regulator 120 according to the result of processing so as to increase or decrease the pressure in the pressure container 124.

Preferably, the controller 140 has a robot adjustment setting portion 141. The robot adjustment setting portion 141 is for the purpose of enabling adjustment of the posture of the robot 110 such that the same can move the nozzle 112 onto the measurement reference line and can perform operations of a preset process. The controller 140 is configured to enable the robot 110 to operate according to a preset order and, if necessary, with reference to a result value obtained by processing image data applied from the camera 130.

The controller 140 has an image data processing portion 143 for processing image data applied from the camera 130 and thereby calculating the height of the nozzle 112, the width and transverse center of the nozzle 112, and the pattern-width and transverse center of the dispensed coating liquid CL. The image data processing portion 143, most basically, finds pixels of both side edges of the dispensed coating liquid CL on the coating reference surface CS from the image data of the dispensed coating liquid CL, and calculates the pattern-width of the dispensed coating liquid from the positions of the pixels of both side edges. The edges of the dispensed coating liquid CL correspond to positions of pixels on the obtained image data, the brightness contrast values of which on the coating reference surface CS change abruptly. Preferably, the transverse center of the dispensed coating liquid CL is additionally calculated from the positions of pixels of both side edges.

In addition, the image data processing portion 143 may find the lower edge of the nozzle 112 from the image data of the nozzle 112 that has moved to the target height on the measurement reference line, and preferably finds the transverse center position on the obtained image or the lower edge of the nozzle 112 on the measurement reference line, thereby calculating the height of the nozzle 112.

If necessary, the image data processing portion 143 may find both side edges of the nozzle 112 from image data obtained such that the span between the upper and lower ends of the nozzle 112 straddles the width measurement height on the obtained image (the height of the horizontal straight line marked at the center portion in FIG. 6), thereby calculating the width of the nozzle 112, and may find the transverse center of the nozzle 112.

The controller 140 includes a reference data storage portion 145. The reference data storage portion 145 preferably stores various kinds of reference data necessary to control the pattern-width of the dispensed coating liquid, including the measurement reference line, the coating reference surface CS, the height reference, the width measurement height, the reference width of the nozzle, the transverse center reference of the nozzle, the allowed transverse error of the transverse center of the nozzle, the reference pattern-width of the coating liquid, the transverse center reference of the coating liquid, the transverse allowed error of the transverse center of the coating liquid, the reference allowed error regarding the pattern-width of the coating liquid, ROI (Region of Interest) data regarding the position and range of pixels when finding the lower end of the nozzle or the transverse edge of the nozzle, and ROI data regarding the position and range of pixels when finding the edge of the dispensed coating liquid. Other kinds of reference data necessary to implement the present invention than the above-mentioned reference data may also be stored. The reference data storage portion 145 may be a memory area of a block in which pieces of reference data are solely gathered and stored, but may also be multiple separated memory areas, if necessary, which are assigned to respective pieces of reference data or respective groups of correlated reference data.

The controller 140 includes a comparison portion 147. The comparison portion 147 is configured to compare a value calculated by the image data processing portion 143 with reference data stored in the reference data storage portion 145, thereby calculating an error value, and to determine whether or not the calculated error value is within an allowed range.

In addition, the controller 140 preferably includes a lighting adjustment portion 149 for adjusting the brightness of the lighting portion 132 and an air pressure adjustment portion 142 for adjusting the operation of the pressure regulator 120 according to the result of comparison by the comparison portion 147, thereby adjusting the air pressure in the pressure container 124.

The apparatus 100 for controlling the pattern-width of a coating liquid dispensed from a nozzle according to the present invention has a warning means 160. The warning means 160 is for the purpose of generating a warning signal under the control of the controller 140 when the image data processing portion 143 fails to calculate one selected from the height of the nozzle, the width of the nozzle, and the pattern-width of the dispensed coating liquid, or when the calculated error value exceeds a preset value. The warning means 160 may be a speaker or a warning light, and the display 170 may also play the role of the warning means 160. The warning means 160 may be configured in various manners, and a plurality of alarm means 160 may be provided.

The apparatus 100 for controlling the pattern-width of a coating liquid dispensed from a nozzle according to the present invention preferably has a display 170 for displaying necessary particulars and an input portion 180 for entering an instruction and the like.

FIG. 4A and FIG. 4B are flowcharts illustrating processes of a method for controlling the pattern-width of a coating liquid dispensed from a nozzle according to the present invention, FIG. 5 is a photograph of a nozzle obtained to calculate the height of the nozzle, FIG. 6 is a photograph of a nozzle obtained to calculate the width of the nozzle, and FIG. 7 is a photograph of a dispensed coating liquid obtained to calculate the pattern-width of the dispensed coating liquid on a coating reference surface.

A method for controlling the pattern-width of a coating liquid dispensed from a nozzle according to the present invention will now be described with reference to FIG. 1 to FIG. 7 as well.

Generally, in the case of no coating operation, the nozzle 112 illustrated in FIG. 1 remains immersed in the solvent in the first container 104 and stands by. When a robot initialization command is input through the input portion 180, the robot adjustment setting portion 141 sets the air pressure to the reference air pressure (default pressure) through interworking with another constituent element, such as the air pressure adjustment portion 142, according to a preset value (S1). The robot 110 moves the nozzle 112 onto the second container 105 and dispenses approximately twice, thereby removing the solvent smeared on the nozzle 112 in advance (S2). The robot 110 then moves the nozzle 112 to the target height for nozzle height measurement on the measurement reference line (S3). When it is confirmed that the robot 110 has moved the nozzle 112 to the target height for height measurement (S4), the camera 130 photographs the nozzle 112 and applies the resulting image data to the image data processing portion 143 (S5).

The image data processing portion 143 finds a pixel having an abruptly changing brightness contrast on the lower end of the nozzle 112 within the ROI (Region of Interest) range, with reference to the ROI value stored in the reference data storage portion, from the image data obtained by photographing the nozzle 112 and delivered from the camera 130. Preferably, the image data processing portion 143 finds an end portion of the nozzle 112 on the transverse center line of the obtained image or on the measurement reference line. The ROI is normally set in an area unit, but is preferably set in a line unit according to the present invention. Each line, when calculated in a pixel unit, may have multiple pixels in the transverse direction. However, the ROI region is substantially reduced compared with the prior art, and the data processing rate (measurement rate) can be increased by appropriately selecting only the necessary part as the ROI. The ROI may be set by using position and range values on the screen, such as 4 mm from the reference height of an obtained image, or coordinate values of pixels described in terms of x and y coordinate values. The ROI may also be adjusted and set. The brightness contrast value may be set to be 10, for example, and stored in the reference data storage portion 145, and may be adjusted and set.

The reference height is preferably set as the middle height of the obtained image, but may be differently set as needed. The ROI setting value may be set by finding an appropriate value for the robot, the type of printed circuit board, the horizontal distance between the camera and the measurement reference line and the like through empirical value or repeated experiments.

When the lower end of the nozzle 112 fails to be detected, an alarm signal is applied by the warning means 160, thereby issuing a warning (S7). When the warning signal is issued, the user finds the reason of detection failure and solves the same.

When the lower end of the nozzle 112 is detected, the detected point is marked by a dot as illustrated in FIG. 5, and the height of the nozzle 112 is calculated (S8). The calculated height of the nozzle 112 and the reference height stored in the reference data storage portion 145 are compared, thereby calculating the height error (S9). For example, the height of the end of the nozzle 112 may be higher than the reference height by 0.04 mm. Such a height error is preferably displayed on the display 170 together with the photograph illustrated in FIG. 5 such that the operator can notice the same.

The nozzle 112 is preferably moved up and then moved down such that the span between the upper and lower ends of the nozzle 112 straddle the width measurement height as illustrated in FIG. 6 (S10). The camera 130 photographs the nozzle 112 in this condition and applies image data to the image data processing portion 143 (S11).

The image data processing portion 143 finds both side edges of the nozzle 112 within the ROI range with reference to the ROI value stored in the reference data storage portion 145 (S12). ROI data, when calculating the width of the nozzle 112, may be given as position and range values of reference pixels near both side edges of the nozzle 112 at the reference height. In this case, the range value of the ROI may be set to be 8 mm, for example, and is adjustable. The brightness contrast value may be set to be 10, for example, and stored in the reference data storage portion 145, and may be adjusted and set. When both side edges of the nozzle 112 fail to be detected, an alarm signal is applied to the warning means 160 (S12).

When both side edges of the nozzle 112 are found, the width and transverse center of the nozzle 112 are calculated (S13). The calculated transverse center of the nozzle 112 is compared with the transverse center reference stored in the reference data storage portion 145, thereby calculating the error (S14). Above-described S10 to S14 are preferably conducted after calculating the height error of the nozzle 112, but are not limited thereto, and may also be conducted prior to calculating the height error. For example, when the calculated width of the nozzle 112 is 5.97 mm, and when the transverse center error of the nozzle is −0.31 mm, the same are preferably displayed on the display 170 together with the photograph illustrated in FIG. 6.

The nozzle 112 is moved to the dispensing position by reflecting the height error of the nozzle 112 calculated in S9 (S15), and the coating liquid is dispensed from the nozzle 112 toward the coating reference surface CS (S16). The dispensing position is on the measurement reference line, and the height thereof is equal to the height of the nozzle 112 with regard to the coating reference surface CS when performing a coating operation.

The camera 130 photographs the coating liquid CL dispensed from the nozzle 112 as illustrated in FIG. 7, and applies the resulting image data to the image data processing portion 143 (S17). The image data processing portion 143 finds both side edges of the coating liquid within a predetermined range of the coating reference surface CS with reference to the ROI data stored in the reference data storage portion 145 (S18). The ROI for calculating the pattern-width of the coating liquid may be determined as the position and range of reference pixels near both side edges of the dispensed coating liquid on the coating reference surface CS. The reference pixels may be determined as pixels of both side edges of the coating liquid on the coating reference surface CS assuming that the same are dispensed most ideally. In this case, the ROI range may be set to be 15 mm, the brightness contrast value may be set to be 12, for example, and the sizes thereof may be adjusted and set.

When both side edges of the dispensed coating liquid fail to be found within the ROI range, S7 is performed.

When both side edges of the dispensed coating liquid are found, the pattern-width and transverse center of the dispensed coating liquid CL on the coating reference surface CS are calculated (S19), and the calculated transverse center and the transverse center reference are compared, thereby calculating the error (S20). For example, when the calculated pattern-width of the coating liquid is 7.83 mm, and when the error of the transverse center is −0.39 mm, the same are preferably displayed on the display 170 together with the photograph illustrated in FIG. 7.

The transverse center error of the nozzle 112 is subtracted from the transverse center error of the dispensed coating liquid CL, thereby calculating the degree of deviation of the coating liquid CL (S21). The comparison portion 147 compares the degree of deviation and confirms whether or not the same is within the allowed error range stored in the reference data storage portion (S22). When the degree of deviation is exceeded the allowed error, S7 is performed. When the degree of deviation of the dispensed coating liquid CL is within the allowed error range, it is confirmed whether or not the pattern-width of the dispensed coating liquid on the coating reference surface CS is outside the reference allowed error range (S23).

When the error of the transverse center of the nozzle 112 is −0.31 mm, and when the error of the transverse center of the dispensed coating liquid is −0.39 mm, as exemplified above, the degree of deviation of the coating liquid dispensed from the nozzle 112 is 0.08 mm. Accordingly, if the transverse allowed error of the dispensed coating liquid is 0.2 mm, S23 is performed without generating an alarm signal; and, if the allowed error is smaller than 0.08 mm, an alarm signal is generated.

When the pattern-width of the dispensed coating liquid on the coating reference surface CS is within the reference allowed error range, a coating operation is started in that condition (S24). If the same is outside the reference allowed error range, the air pressure adjustment portion 142 of the controller 140 controls the operation of the pressure regulator 120, thereby increasing or decreasing the pressure of air supplied to the pressure container 124 (S25), and the processes of S16 to S23 are repeated. If the pattern-width is within the reference allowed error range, S24 is performed, and the procedure is then ended. The processes of S16 to S23 proceed almost in real time, and, with reference to both side edges, lines displayed on the display 170 inside and outside both side edges have different colors.

Normally, when the pattern-width of the dispensed coating liquid is smaller than the reference pattern-width, the processes of S16 to S23 are repeated while increasing the pressure of air supplied to the nozzle 112; and, when the same is larger than the reference pattern-width, the processes of S16 to S23 are repeated while decreasing the pressure of air supplied to the nozzle 112. The pattern-width of the dispensed coating liquid is adjusted in this manner.

That is, according to the present invention, when the measurement value regarding the pattern-width of the dispensed coating liquid is not within a predetermined reference allowed error, the pressure of air supplied to the pressure container 124 is automatically corrected by the pressure regulator 120, thereby adjusting the pattern-width of the dispensed coating liquid. This is measured in real time, and, if the pattern-width of the spayed coating liquid enters the reference allowed error, the setting may be completed, and a coating operation may begin.

When the method according to the present invention described above is followed, the precision of measurement of a non-atomized film pattern can be improved from the conventional mm-unit level precision, which corresponds to the size of the diameter of a laser spot for example, to a 10 µm-unit level precision which corresponds to the size of a pixel on a screen depending on the resolution of image data obtained by the camera. In addition, the coating liquid dispensing time does not need to continue for a long time, making it possible to reduce the amount of consumed coating liquid and the operation time.

Although it has been assumed in the above description that a ROI is set to quickly find the edge of the nozzle or the dispensed coating liquid, the procedure may be performed without setting the ROI. In this case, a warming signal may be issued when the measured value exceeds the allowed error by a predetermined value or more, instead of issuing a warning signal in the case of edge recognition failure.

FIG. 8 is a perspective view of a camera mounted on a bracket. FIG. 9 to FIG. 11 are the front view, the right-side view, and the top view of FIG. 8, respectively.

Referring to FIG. 8 to FIG. 11, the camera 130 is installed on the frame 101, which is positioned at a predetermined horizontal distance from the measurement reference line, by a bracket mechanism 150 so as to photograph the nozzle 112 on the measurement reference line and the coating liquid CL dispensed from the nozzle 112, thereby obtaining image data of the nozzle 112 on the measurement reference line and the dispensed coating liquid CL.

The bracket mechanism 150 includes a side plate 151, a front-end support portion 153 protruding laterally from the front part of the side plate 151 so as to support the front end of the camera 130, and a rear-end support portion 155 protruding laterally from the rear part of the side plate 151 so as to support the rear end of the camera 130.

The side plate 151 has a long hole 151a formed therein such that the front-end support portion 153 can be moved leftward/rightward as needed and then fixed, and has a ledge 151b formed below the long hole 151a so as to support the bottom surface of the front-end support portion 153.

The side plate 151 also has a long hole 151c formed in the lower portion thereof such that the same can be moved leftward/rightward and then fixed to the frame.

Although the bracket mechanism 150 has been described with reference to FIG. 8 to FIG. 11 in connection with a preferable example thereof configured such that the camera 130 can be moved leftward/rightward and then fixed, it would be obvious to a person skilled in the art the same could be modified variously.

When installed on the frame by the bracket mechanism 150 according to the present invention as described above, the camera 130 can be fixed after adjusting the horizontal distance easily between the same and the measurement reference line as needed, and after adjusting the height thereof.

INDUSTRIAL APPLICABILITY

The present invention is appropriate and applicable to a conformal coating device for coating a printed circuit board with a solution, for example.

What is claimed is:

1. A method for controlling the pattern-width of a coating liquid dispensed from a nozzle, the method comprising:
dispensing the coating liquid downward from the nozzle in a dispensing position to photograph with a camera positioned at a predetermined horizontal distance from a measurement reference line arranged perpendicularly to a coating reference surface;
photographing the dispensed coating liquid with the camera;
calculating the pattern-width of the coating liquid on the coating reference surface from image data obtained by photographing the coating liquid dispensed from the nozzle in the dispensing position with the camera;
comparing the calculated pattern-width of the coating liquid with a coating liquid reference pattern-width and thereby determining whether or not the calculated pattern-width of the coating liquid is outside a reference allowed error range; and
adjusting dispensing pressure by increasing or decreasing pressure of air supplied to a pressure container that provides the coating liquid to the nozzle when the calculated pattern-width of the coating liquid is outside the reference allowed error range;
calculating a transverse error of the nozzle prior to the dispensing by calculating the width of the nozzle from image data obtained by photographing the nozzle on the measurement reference line, finding the transverse center of the nozzle, and calculating an error of the transverse center of the nozzle with regard to the a transverse center reference on the obtained image;
calculating a coating liquid transverse error by finding the transverse center of the coating liquid on a coating reference surface from image data obtained by photographing the coating liquid and calculating the error of the transverse center of the coating liquid with regard to the transverse center reference on the obtained image;
subtracting the error of the transverse center of the nozzle from the error of the transverse center of the coating liquid and thereby calculating a degree of deviation of the coating liquid with regard to the nozzle;
determining whether or not the calculated degree of deviation of the coating liquid is outside an allowed error; and
generating an alarm signal when the degree of deviation of the coating liquid is outside the allowed error.

2. The method of claim 1, wherein the dispensing, the photographing, the calculating, the comparing, and the adjusting dispensing pressure are repeated until the pattern-width of the coating liquid calculated for a preset time enters the reference allowed error range of the coating liquid reference pattern-width.

3. The method of claim 1, comprising, prior to the dispensing: calculating a height error of the nozzle, with regard to a height reference on an obtained image or with regard to the coating reference surface, from image data obtained by photographing the nozzle on the measurement reference line with the camera; and moving the nozzle upward/downward to the dispensing position along the measurement reference line in view of the height error.

4. The method of claim 1, comprising: finding a pixel having an abruptly changing brightness contrast value within a preset range near an edge of the nozzle and near an edge of the dispensed coating liquid in order to calculate the height of the nozzle, the width of the nozzle, and the pattern-width of the dispensed coating liquid; and
generating an alarm signal when failing to measure the height of the nozzle or the width of the nozzle from image data obtained by photographing the nozzle on the measurement reference line prior to the dispensing, or when failing to measure the pattern-width of the dispensed coating liquid from image data obtained by photographing the coating liquid.

5. The method of claim 1, comprising,
performing a height error calculation so as to calculate the height error of the nozzle, and
comparing the calculated height error of the nozzle with a reference value, and generating an alarm signal when the calculated height error of the nozzle is outside an allowed error, wherein
in the height error calculation, the height error of the nozzle is calculated prior to the dispensing, with regard to a height reference on an obtained image or with regard to the coating reference surface, from image data obtained by photographing the nozzle on the measurement reference line with the camera.

6. The method of claim 1, comprising:

calculating a height error by calculating a height error of the nozzle, with regard to a height reference on an obtained image or with regard to the coating reference surface, from image data obtained by photographing the nozzle on the measurement reference line with the camera; and moving the nozzle upward/downward to the dispensing position along the measurement reference line in view of the height error, wherein the calculating the transverse error of the nozzle is performed from image data obtained by moving the nozzle downward and photographing the nozzle with the camera, after the calculating a height error.

\* \* \* \* \*